(12) United States Patent
Suenaga

(10) Patent No.: US 7,619,439 B2
(45) Date of Patent: Nov. 17, 2009

(54) SEMICONDUCTOR DEVICE

(75) Inventor: Shuji Suenaga, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/155,527

(22) Filed: Jun. 5, 2008

(65) Prior Publication Data
US 2008/0315915 A1   Dec. 25, 2008

(30) Foreign Application Priority Data
Jun. 22, 2007   (JP) .............................. 2007-165088

(51) Int. Cl.
*H03K 17/16* (2006.01)
(52) U.S. Cl. .............................. 326/30; 326/32; 326/34; 326/87
(58) Field of Classification Search .................. 326/30, 326/87; 327/112
See application file for complete search history.

(56) References Cited

U.S. PATENT DOCUMENTS

| | | | | |
|---|---|---|---|---|
| 6,947,336 B2 * | 9/2005 | Kim et al. | .............. | 365/189.05 |
| 7,084,663 B2 * | 8/2006 | Oguri | .......................... | 326/30 |
| 2006/0158198 A1 | 7/2006 | Fujisawa | | |
| 2007/0194798 A1 | 8/2007 | Fujisawa | | |
| 2007/0263459 A1* | 11/2007 | Kim et al. | .............. | 365/189.11 |

FOREIGN PATENT DOCUMENTS

| | | |
|---|---|---|
| JP | 2005-167779 | 6/2005 |
| JP | 2006-203405 | 8/2006 |

* cited by examiner

*Primary Examiner*—Anh Q Tran
(74) *Attorney, Agent, or Firm*—McGinn IP Law Group, PLLC

(57) ABSTRACT

When a plurality of output buffer circuits are provided, chip layout size, power consumption, and number of pins of an LSI circuit are reduced. A voltage generation circuit generates reference voltages corresponding respectively to the output buffer circuits. A comparison circuit compares the reference voltages with an output voltage of a dummy buffer circuit. A counter counts a clock signal until a comparison result of the comparison circuit matches. The dummy buffer circuit adjusts output impedance corresponding respectively to the output buffer circuits based on a count value of the counter. Adjustment value holders hold respective count values when a comparison result of the comparison circuit, obtained based on respective corresponding reference voltages, matches. The output buffer circuits respectively adjust output impedances based on respectively held count values.

7 Claims, 13 Drawing Sheets

FIG.6

| N1 | N2 | N3 | N4 | DUMMY BUFFER IMPEDANCES |
|----|----|----|----|-------------------------|
| L  | L  | L  | L  | ∞                       |
| L  | L  | L  | H  | 8.00                    |
| L  | L  | H  | L  | 4.00                    |
| L  | L  | H  | H  | 2.67                    |
| L  | H  | L  | L  | 2.00                    |
| L  | H  | L  | H  | 1.60                    |
| L  | H  | H  | L  | 1.33                    |
| L  | H  | H  | H  | 1.14                    |
| H  | L  | L  | L  | 1.00                    |
| H  | L  | L  | H  | 0.89                    |
| H  | L  | H  | L  | 0.80                    |
| H  | L  | H  | H  | 0.73                    |
| H  | H  | L  | L  | 0.67                    |
| H  | H  | L  | H  | 0.62                    |
| H  | H  | H  | L  | 0.57                    |
| H  | H  | H  | H  | 0.53                    |

FIG.8

| | CONTROL SIGNAL | | | OUTPUT VOLTAGE OF REFERENCE VOLTAGE GENERATION CIRCUIT | | IMPEDANCE OFFSET OF DUMMY BUFFER | IMPEDANCE OFFSET OF BUFFER TO BE ADJUSTED | ADJUSTMENT SIGNAL HOLDING CIRCUIT | | |
|---|---|---|---|---|---|---|---|---|---|---|
| | CT1 | CT2 | CT3 | VrefH | VrefL | | | E1A | E1B | E1C |
| INTERFACE A | H | L | L | LOW | HIGH | OFFSET IMPEDANCE: NONE | OFFSET IMPEDANCE: NONE | PASS | HOLD | HOLD |
| INTERFACE B | L | H | L | MEDIUM | MEDIUM | OFFSET IMPEDANCE: SMALL | OFFSET IMPEDANCE: SMALL | HOLD | PASS | HOLD |
| INTERFACE C | L | L | H | HIGH | LOW | OFFSET IMPEDANCE: LARGE | OFFSET IMPEDANCE: LARGE | HOLD | HOLD | PASS |

FIG.9

| Nr. OF PARALLEL CONNECTIONS | IMPEDANCE [Ω] | CURRENT [mA] | CURRENT DIFFERENCE PER PARALLEL CONNECTION [mA] |
|---|---|---|---|
| 1 | 477.71 | 0.84 | — |
| 2 | 239.43 | 1.67 | 0.83 |
| 3 | 159.74 | 2.50 | 0.83 |
| 4 | 119.86 | 3.34 | 0.83 |
| 5 | 95.91 | 4.17 | 0.83 |
| 6 | 79.94 | 5.00 | 0.83 |
| 7 | 68.52 | 5.84 | 0.83 |
| 8 | 59.96 | 6.67 | 0.83 |

FIG.10

| Nr. OF PARALLEL CONNECTIONS | IMPEDANCE [Ω] | CURRENT [mA] | CURRENT DIFFERENCE PER PARALLEL CONNECTION |
|---|---|---|---|
| 1 | 238.85 | 1.67 | — |
| 2 | 119.71 | 3.34 | 1.67 |
| 3 | 79.87 | 5.01 | 1.67 |
| 4 | 59.93 | 6.67 | 1.67 |
| 5 | 47.95 | 8.34 | 1.67 |
| 6 | 39.97 | 10.01 | 1.67 |
| 7 | 34.26 | 11.67 | 1.67 |
| 8 | 29.98 | 13.34 | 1.67 |

FIG.11

|  | CONVENTIONAL CONFIGURATION | PRESENT INVENTION |
|---|---|---|
| Nr. OF PINS | 6 | 2 |
| POWER CONSUMPTION (mW) | 389.4 | 62.7 |
| LAYOUT SIZE (Nr. OF I/Os) | 6 | 2 |

SEMICONDUCTOR DEVICE

REFERENCE TO RELATED APPLICATION

This application is based upon and claims the benefit of the priority of Japanese patent application No. 2007-165088 filed on Jun. 22, 2007, the disclosure of which is incorporated herein in its entirety by reference thereto.

TECHNICAL FIELD

This invention relates to a semiconductor device, and in particular, to a semiconductor device provided with an output buffer circuit having an impedance adjustment function.

BACKGROUND

In recent years, interface circuits for interfacing with other devices (chips) are built into most LSI circuits. In such interface circuits, it is desirable to keep impedance of an output buffer constant, even if elements relating to impedance characteristic of the output buffer, such as process, temperature, or power supply voltage of a semiconductor device, change. If the impedance of the output buffer can be kept constant, delay variations of the output buffer are curtailed, contributing to lowering difficulty of timing design. Thus, there is a large effect with regard to speed improvement in various interface systems. Furthermore, by consistently obtaining a desired impedance, it is possible to curtail excess current, curtailing quantity of generated noise, and enabling a decrease in power consumption.

A semiconductor device provided with an output buffer circuit having this type of impedance adjustment function is disclosed in Patent Document 1. The semiconductor device described in Patent Document 1 is provided with an output buffer having a plurality of PMOS transistors and a plurality of NMOS transistors, a first dummy buffer formed of a plurality of PMOS transistors having a similar configuration to the abovementioned plurality of PMOS transistors, a second dummy buffer formed of a plurality of NMOS transistors having a similar configuration to the abovementioned plurality of NMOS transistors, a first conductivity controller which adjusts a combination of conductivities of the plurality of PMOS transistors forming the first dummy buffer, based on a resistance value of a first reference resistor connected to an external terminal, a second conductivity controller which adjusts a combination of conductivities of the plurality of NMOS transistors forming the second dummy buffer, based on a resistance value of a second reference resistor connected to an external terminal, a first register which registers an adjustment result of the first conductivity controller, and outputs this registered data to the plurality of PMOS transistors of the output buffer, a second register which registers an adjustment result of the second conductivity controller, and outputs this registered data to the plurality of NMOS transistors of the output buffer, and a conductivity period controller which controls conductivity periods of the first dummy buffer and the second dummy buffer, wherein the conductivity period controller makes the first dummy buffer and the second dummy buffer conductive for a period equivalent to a conductivity period of the output buffer.

Furthermore, Patent Document 2 discloses a semiconductor device in which circuit size necessary for a calibration (impedance adjustment) operation of an output circuit and time taken for the calibration operation are reduced. This semiconductor device is provided with a first output buffer which is connected to data pins and is activated at least at data output time, a second output buffer which is connected to the data pins and is activated at least at ODT (On Die Termination) time, and a calibration circuit which is connected to calibration pins and commonly sets impedance of the first and the second output buffers.

[Patent Document 1]
 Japanese Patent Kokai Publication P2005-167779A

[Patent Document 2]
 Japanese Patent Kokai Publication P2006-203405A

SUMMARY OF THE DISCLOSURE

The entire disclosure of Patent Documents 1 and 2 is incorporated herein by reference thereto.

The following analysis is given in the present invention.

With increasing multi-functionality of LSI circuits as SOCs (System On a Chip) products, plural interface circuits are increasingly mixed within 1 chip. With these types of LSI circuits, it is necessary to provide a plurality of output buffer circuits having an impedance adjustment function such as explained above in the Background. In such cases, there is a risk of chip layout size, power consumption, and number of pins of the LSI circuit, related to the impedance adjustment function, increasing along with the number of output buffer circuits.

A semiconductor device according to one aspect of the present invention is provided with: a voltage generation circuit which generates reference voltages; a comparison circuit which compares a reference voltage and an output voltage of a dummy buffer circuit; a counter which counts a clock signal until a comparison result of the comparison circuit is matched; a dummy buffer which adjusts its own output impedance based on a count value of the counter; n adjustment value holding circuits (n is an integer greater than or equal to 2) which hold count values when a comparison result of the comparison circuit is matched; n output buffer circuits which respectively adjust their own output impedances, based on count values respectively held by the adjustment value holding circuits; wherein the voltage generation circuit generates the reference voltages respectively corresponding to the n output buffer circuits, the n adjustment value holding circuits hold respective count values when a comparison result, obtained based on respectively corresponding reference voltages, matches, and the dummy buffer circuit adjusts its own output impedance corresponding respectively to the n output buffer circuits.

The meritorious effects of the present invention are summarized as follows.

According to the present invention, for n output buffer circuits, it is possible to have one voltage generation circuit, comparison circuit, counter, and dummy buffer circuit in common. Thus, it is possible to curtail increase of each of chip layout size, power consumption, and number of pins of the LSI circuit.

BRIEF DESCRIPTIONS OF THE DRAWINGS

FIG. 6 is a drawing showing change in impedance of a dummy buffer circuit.

FIG. 8 is a diagram showing setting conditions for 3 interfaces.

FIG. 9 is a diagram showing impedance setting values of dummy buffers with an adjustment current target of 6 mA.

FIG. 10 is a diagram showing impedance setting values of dummy buffers with an adjustment current target of 6 mA and 12 mA.

FIG. 11 is a diagram showing quantitative effects of the present invention.

PREFERRED MODES OF THE INVENTION

Figure 1:
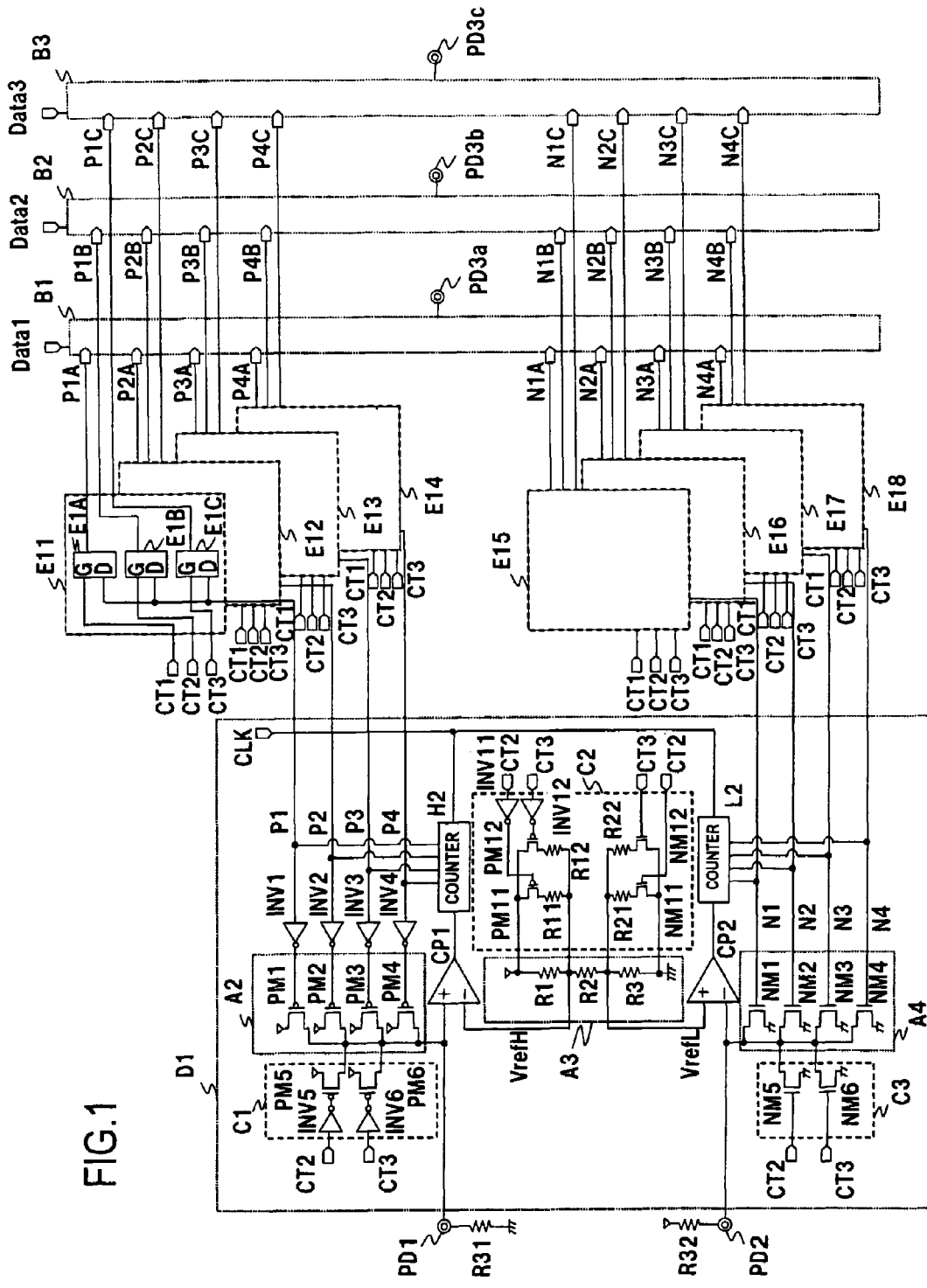
FIG. 1 is a block diagram showing a configuration of a semiconductor device according to a first exemplary embodiment of the present invention.

A semiconductor device according to an exemplary embodiment of the present invention is provided with a voltage generation circuit, a comparison circuit, a counter, a dummy buffer circuit, n adjustment value holding circuits, and n output buffer circuits. The voltage generation circuit generates reference voltages corresponding to each of the n output buffer circuits. The comparison circuit compares the reference voltages and an output voltage of the dummy buffer circuit. The counter counts a clock signal until a comparison result of the comparison circuit matches. The dummy buffer circuit handles each of the n output buffer circuits, and adjusts its own output impedance based on a count value of the counter. The n adjustment value holding circuits hold respective count values when a comparison result of the comparison circuit, obtained based on respective corresponding reference voltages, matches. The n output buffer circuits respectively adjust their own output impedances based on count values respectively held by the adjustment value holding circuits.

In the semiconductor device of the present invention, the output buffer circuits may include m (m is an integer greater than or equal to 2) first output transistors connected in parallel, which drive output pads, and m second output transistors that are of a conductivity type opposite to the first output transistors, are connected in parallel, and which drive the output pads; each of the voltage generation circuit, the comparison circuit, the counter, and the dummy buffer circuit, and the n adjustment value holding circuits may be provided in groups of 2, corresponding to the first and the second output transistors, and respective driving counts of the first and the second output transistors may be determined according to count values respectively held by two of the adjustment value holding circuits.

Moreover, in the semiconductor device of the present invention, the dummy buffer may be provided with a first dummy buffer circuit including m first dummy transistors, which are connected in parallel and drive a first pseudo-pad, and a second dummy buffer circuit including m second dummy transistors that are of a conductivity type opposite to the first dummy transistors, are connected in parallel and drive a second pseudo-pad; and respective driving counts of the first and the second dummy transistors may be determined according to count values respectively held by two counters.

Furthermore in the semiconductor device of the present invention, the output buffer circuit is an output circuit with output offset transistors, provided with first output offset transistors connected in parallel to the first output transistors and having a conductivity type the same as the first output transistors, and second output offset transistors connected in parallel to second output transistors and having a conductivity type the same as the second output transistors; the dummy buffer circuit is provided with first offset transistors having a conductivity type the same as the first dummy transistors, and second offset transistors having a conductivity type the same as the second dummy transistors; and in cases in which the dummy buffer circuit determines driving count of each of the first and the second output transistors of the output buffer circuit with output offset transistor, the first offset transistors are preferably connected in parallel to the first dummy transistors, and the second offset transistors are preferably connected in parallel to the second dummy transistors.

Moreover, in the semiconductor device of the present invention, the first output offset transistors and the first offset transistors are the same size, and the second output offset transistors and the second offset transistors are the same size.

Furthermore, in the semiconductor device of the present invention, the dummy buffer circuit is provided with at least 2 first offset transistors, and second offset transistors equal in number to the first offset transistors; and in cases in which the dummy buffer circuit determines driving count of each of the first and the second output transistors of the output buffer circuit with output offset transistor, control is preferably performed so that at least 2 of the first offset transistors are selectively connected in parallel to the first dummy transistors, and that at least 2 of the second offset transistors are selectively connected in parallel to the second dummy transistors.

Moreover, in the semiconductor device of the present invention, it is preferable that ON-time impedance of the first output offset transistors and total ON-time impedance of the selected first offset transistors are the same, and that ON-time impedance of the second output offset transistors and total ON-time impedance of the selected second offset transistors are the same.

According to the semiconductor device as described above, for n output buffer circuits, information necessary for impedance adjustment of the respective output buffer circuits is held in the adjustment value holding circuits; and one of the voltage generation circuit, the comparison circuit, the counter, and the dummy buffer circuit are shared. Thus, in the plurality of output buffer circuits in which impedance is adjusted, it is possible to curtail increase in the number of pins, power consumption, and layout size. A detailed explanation is given below, according to exemplary embodiments, referring to the drawings.

Exemplary Embodiment 1

FIG. 1 is a block diagram showing a configuration of a semiconductor device according to a first exemplary embodiment of the present invention. In FIG. 1, the semiconductor device is provided with output buffer circuits B1, B2, and B3, output pads PD3a, PD3b, and PD3c, adjustment value holders E11 to E18, an automatic impedance adjuster D1, output pads (pseudo-pads) PD1 and PD2, and resistance elements R31 and R32.

The automatic impedance adjuster D1 is provided with a reference voltage generation circuit A3, an output voltage switching circuit C2, dummy buffer circuits A2 and A4, offset switching circuits C1 and C3, comparators CP1 and CP2, counters H2 and L2, and inverter circuits INV1 to INV4.

The reference voltage generation circuit A3 is provided with resistance elements R1, R2, and R3, connected in series, from a power supply to ground. A voltage VrefH of a node between the resistance elements R1 and R2 is given as a reference voltage to the comparator CP1. Moreover, a voltage VrefL of a node between the resistance elements R2 and R3 is given as a reference voltage to the comparator CP2.

The output voltage switching circuit C2 is provided with a circuit connecting a resistance element R11 and a Pch transistor PM11 in series, and a circuit connecting a resistance element R12 and a Pch transistor PM12 in series, between a power supply and a node between the resistance elements R1 and R2. Control signals CT2 and CT3, which control interface switching via the inverter circuits INV11 and INV12, are respectively given to respective gates of the Pch transistors PM11 and PM12.

Furthermore, the output voltage switching circuit C2 is provided with a circuit connecting a resistance element R21 and an Nch transistor NM11 in series, and a circuit connecting a resistance element R22 and an Nch transistor NM12 in series, between ground and a node between the resistance elements R2 and R3. Control signals CT2 and CT3, are respectively given to respective gates of the Nch transistors NM11 and NM12.

The comparator CP1 has an inverting (−) input terminal connected to a node between the resistance elements R1 and R2, a non-inverting (+) input terminal connected to the output pad PD1 that is grounded via the resistance element R31, and an output end connected to a count enabling terminal of the counter H2.

The counter H2, being a 4-bit counter, counts a clock signal CLK, until potential of the non-inverting (+) input terminal of the comparator CP1 exceeds potential of the inverting (−) input terminal, that is, in cases in which output of the comparator CP1 is at an L level. In cases in which output of the comparator CP1 is at a H level, the count of the clock signal CLK is stopped. Four-bit count values P1, P2, P3, and P4 are outputted to respective gates of Pch transistors PM1, PM2, PM3, and PM4, in the dummy buffer circuit A2, via respective inverter circuits INV1, INV2, INV3, and INV4. Furthermore, the count value P1 is the top bit and the count value P4 is the bottom bit, and the count values P1, P2, P3, and P4 initially are all set to the L level by a reset signal not shown in the drawing. Moreover, ratios of respective ON resistance values in the Pch transistors PM1, PM2, PM3, and PM4 are set to be 1:2:4:8.

The offset switching circuit C1 is provided with Pch transistors PM5 and PM6, and inverter circuits INV5 and INV6. Control signals CT2 and CT3 are respectively given to respective gates of the Pch transistors PM5 and PM6, via the inverter circuits INV5 and INV6.

Sources of the Pch transistors PM1, PM2, PM3, PM4, PM5, and PM6 are all connected to a power supply, and drains are all connected to the output pad PD1.

The comparator CP2 has a non-inverting (+) input terminal connected to a node between the resistance elements R2 and R3, an inverting (−) input terminal connected to the output pad PD2 that is connected to a power supply via the resistance element R32, and an output end connected to a count enabling terminal of the counter L2.

The counter L2, being a 4-bit counter, counts a clock signal CLK, until potential of the non-inverting (+) input terminal of the comparator CP2 exceeds potential of the inverting (−) input terminal, that is, in cases in which output of the comparator CP2 is at an L level. In cases in which output of the comparator CP2 is at a H level, the count of the clock signal CLK is stopped. Four-bit count values N1, N2, N3, and N4 are respectively outputted to respective gates of Nch transistors NM1, NM2, NM3, and NM4, in the dummy buffer circuit A4. Furthermore, the count value N1 is the top bit and the count value N4 is the bottom bit, and the count values N1, N2, N3, and N4 are initially all set to the L level by a reset signal not shown in the drawing. Moreover, ratios of respective ON resistance values in the Nch transistors NM1, NM2, NM3, and NM4 are set to be 1:2:4:8.

The offset switching circuit C3 is provided with Nch transistors NM5 and NM6. Control signals CT2 and CT3 are respectively given to respective gates of the Nch transistors NM5 and NM6.

Sources of the Nch transistors NM1, NM2, NM3, NM4, NM5, and NM6 are all grounded, and drains are all connected to the output pad PD2.

The adjustment value holders E11 to E18 have the same structure, and are provided with logic holding circuits E1A, E1B, and E1C, such as a latch circuit. The logic holding circuits E1A, E1B, and E1C, when respective input terminals G thereof are active, hold data signals given to input terminals D, and perform output from output terminals.

Here the adjustment value holder E11 is explained in an example. The adjustment value holder E11 holds count values P1 when each of the control signals CT1, CT2, and CT3 are active in the respective logic holding circuits E1A, E1B, and E1C. The count values P1 that are held are outputted to input terminals P1A, P1B, and P1C of the respective output buffer circuits B1, B2, and B3. In the same way, the adjustment value holders E12 to E18 output count values P2 to P4, and N1 to N4, respectively held therein, to respective input terminals P2A, P2B, P2C, . . . N4A, N4B, and N4C.

The output buffer circuit B1 outputs, to the output pad PD3a, a signal inputted to an input terminal Data1 with an output impedance based on data inputted to input terminals P1A to P4A, and N1A to N4A.

The output buffer circuit B2 outputs, to the output pad PD3b, a signal inputted to an input terminal Data2 with an output impedance based on data inputted to input terminals P1B to P4B, and N1B to N4B.

The output buffer circuit B3 outputs, to the output pad PD3c, a signal inputted to an input terminal Data3 with an output impedance based on data inputted to input terminals P1C to P4C, and N1C to N4C.

Next, details of the output buffer circuits B1, B2, and B3 will be explained.

Figure 2:
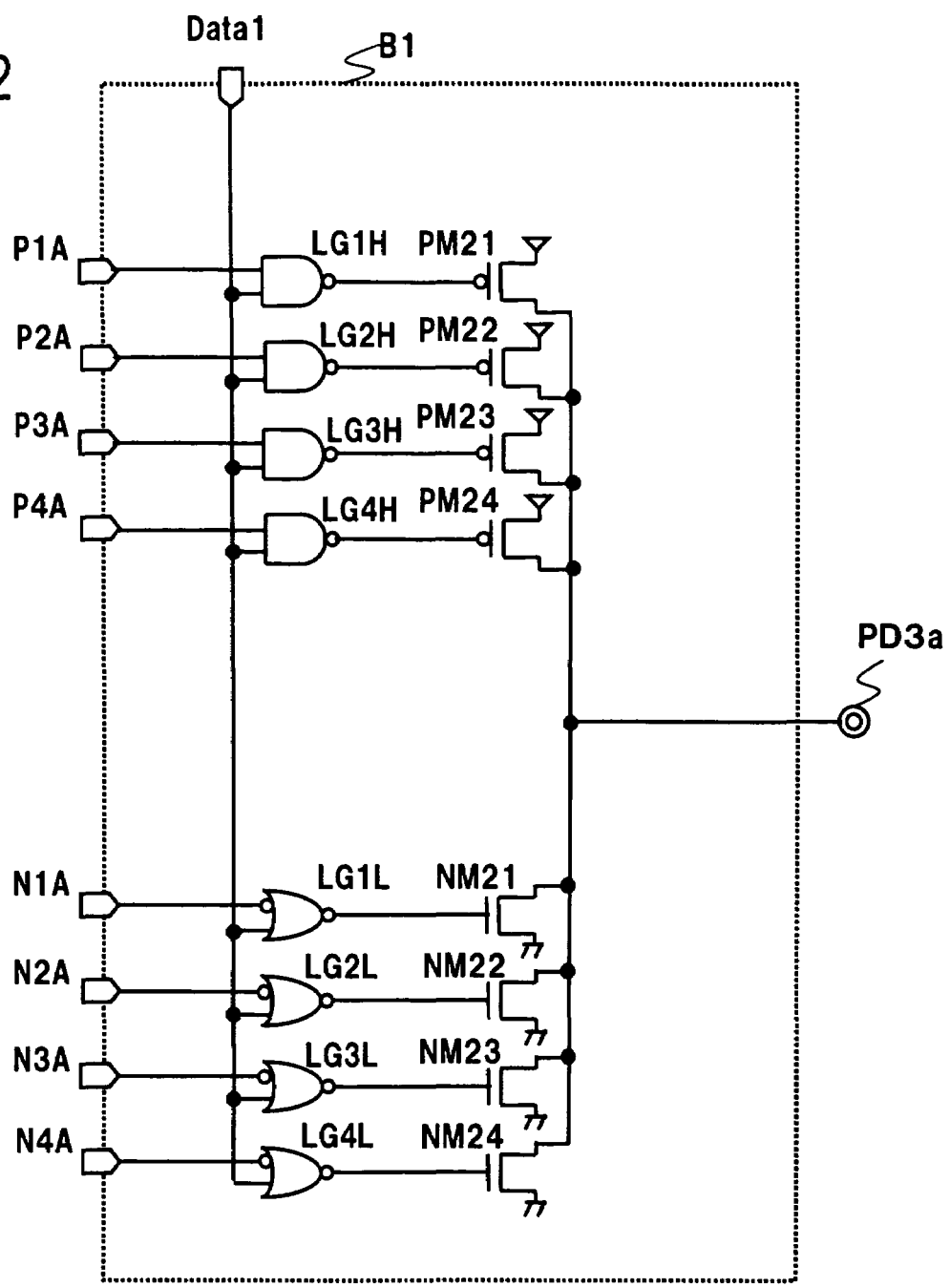
FIG. 2 is a circuit diagram of an output buffer circuit B1.

FIG. 2 is a circuit diagram of the output buffer circuit B1. The output buffer circuit B1 is provided with logic circuits LG1H to LG4H, LG1L to LG4L, Pch transistors PM21 to PM24, Nch transistors NM21 to NM24, input terminals Data1, P1A to P4A, and N1A to N4A. The logic circuits LG1H to LG4H each have a first input end commonly connected to the input terminal Data1, and a second input end connected respectively to input terminals P1A to P4A, and output a result of a NAND operation on a logic value of the 2 input ends to respective gates of the Pch transistors PM21 to PM24. The logic circuits LG1L to LG4L each have a first input end commonly connected to the input terminal Data1, and a second input end connected respectively to input terminals N1A to N4A, and output a result of a NOR operation on a logic value of the first input end and a negative logic value of the second input end, to respective gates of the Nch transistors NM21 to NM24.

Sources of the Pch transistors PM21 to PM24 are connected in common to a power supply, and drains are connected in common to an output pad PD3a. The Pch transistors PM21 to PM24 each have an ON resistance similar to the Pch transistors PM1 to PM4 respectively. Sources of the Nch transistors NM21 to NM24 are connected in common to ground, and drains are connected in common to the output pad PD3a. The Nch transistors NM21 to NM24 each have an ON resistance similar to the Nch transistors NM1 to NM4.

Figure 3:
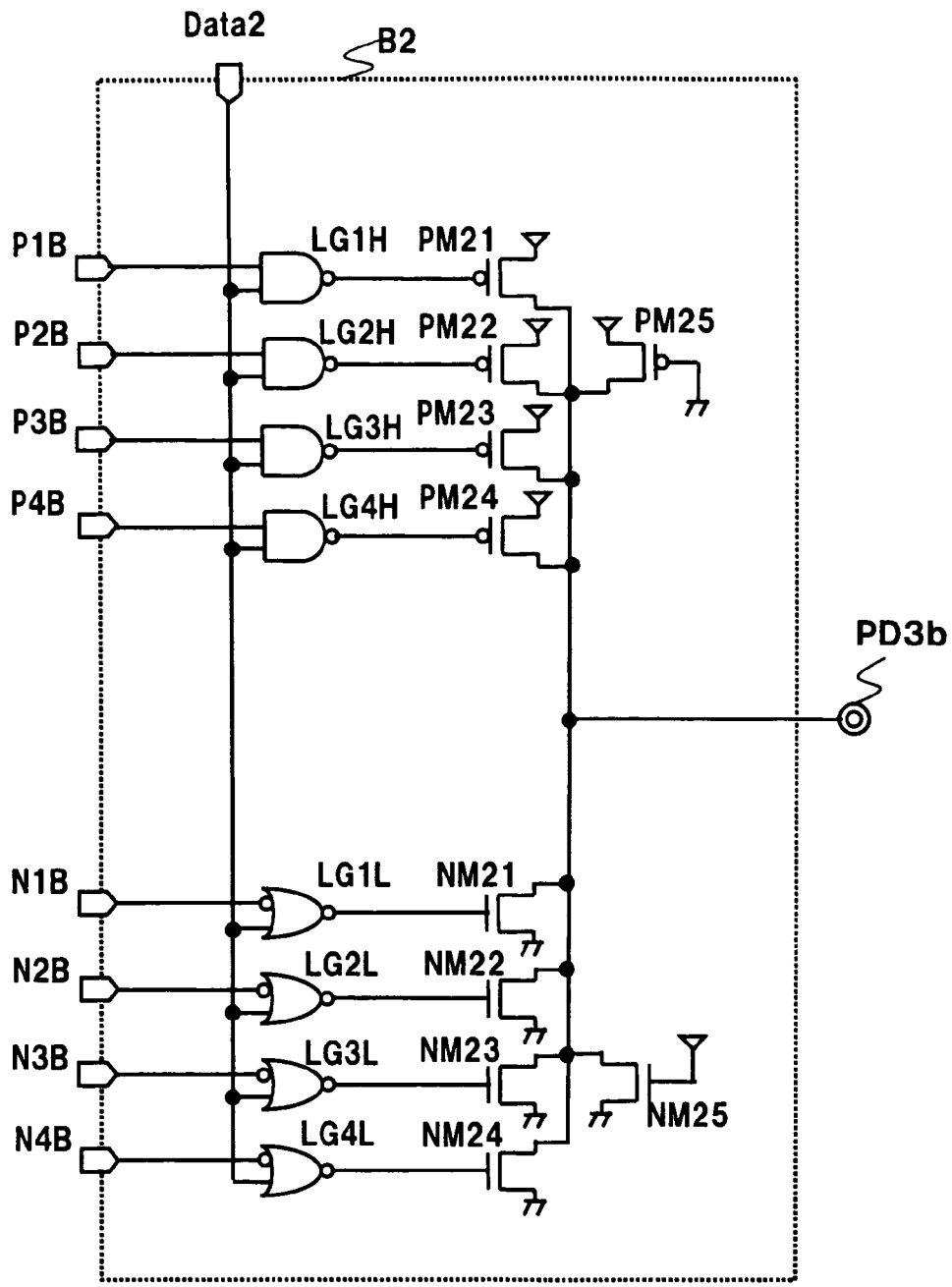
FIG. 3 is a circuit diagram of an output buffer circuit B2.

FIG. 3 is a circuit diagram of the output buffer circuit B2. In FIG. 3 reference symbols identical to FIG. 2 indicate the same items, and explanations thereof are omitted. In the output buffer circuit B2 of FIG. 3, as against FIG. 2, a Pch transistor PM25 and an Nch transistor NM25 are added. The Pch transistor PM25 has a source connected to a power supply, a gate connected to ground, and a drain connected to the output pad PD3b. The Nch transistor NM25 has a source connected to ground, a gate connected to a power supply, and a drain connected to the output pad PD3b.

Furthermore, instead of the input terminals Data1, P1A to P4A, and N1A to N4A of FIG. 2, FIG. 3 has input terminals Data2, P1B to P4B, and N1B to N4B, and an output connection is to the output pad PD3b instead of the output pad PD3a.

Figure 4:
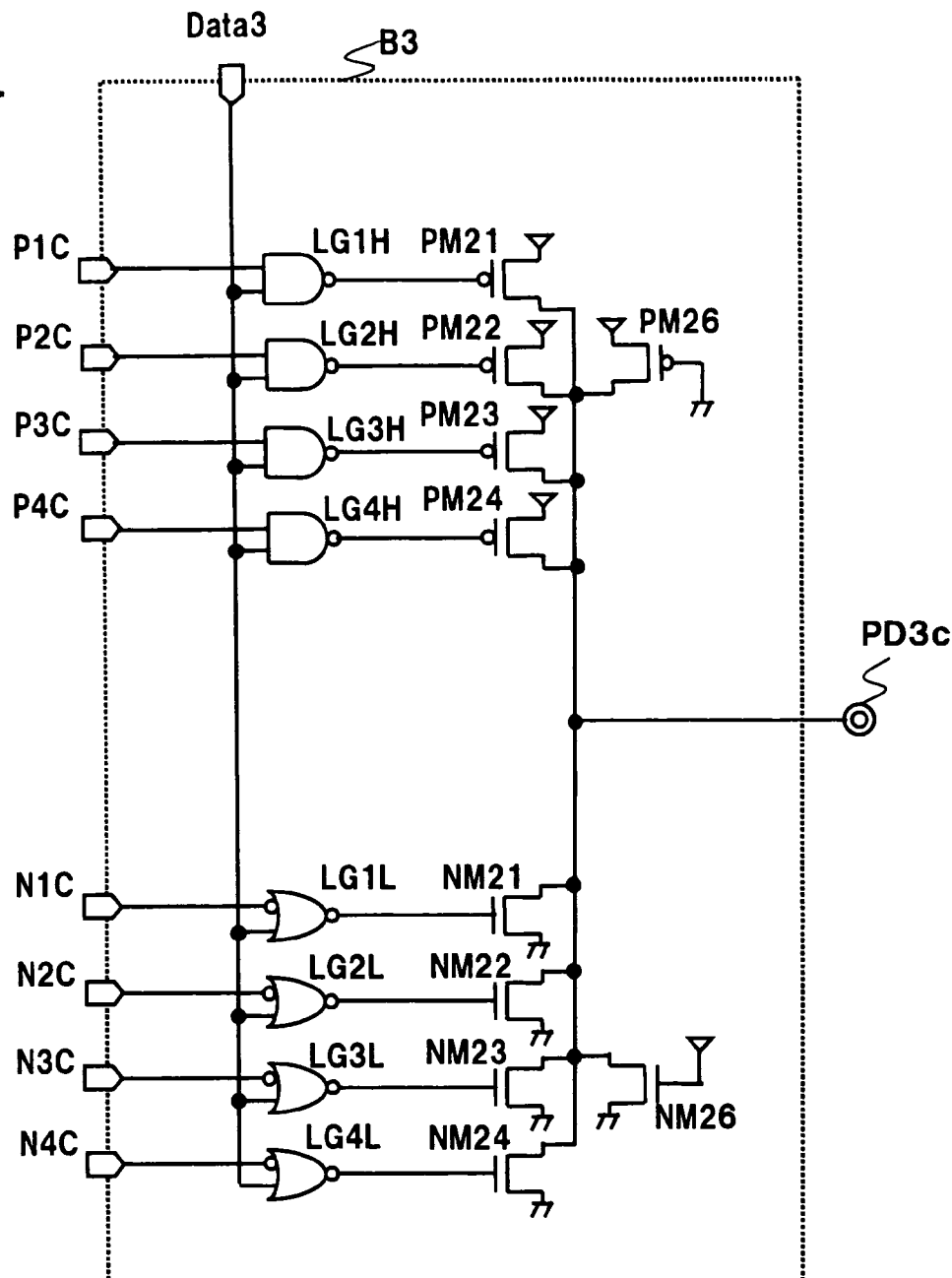
FIG. 4 is a circuit diagram of an output buffer circuit B3.

FIG. 4 is a circuit diagram of the output buffer circuit B3. In FIG. 4 reference symbols identical to FIG. 3 indicate the same items, and explanations thereof are omitted. Instead of the input terminals Data2, P1B to P4B, and N1B to N4B of FIG. 3, FIG. 4 has input terminals Data3, P1C to P4C, and N1C to N4C, and an output connection is to the output pad PD3c instead of the output pad PD3b. Furthermore, instead of the Pch transistor PM25, a differently sized Pch transistor PM26 is provided, and instead of the Nch transistor NM25, a differently sized Nch transistor NM26 is provided.

Next, a method of adjusting impedance in the automatic impedance adjuster D1 will be explained. First, an explanation will be given concerning a method of adjusting dummy buffer circuits A2 and A4 by the comparators CP1 and CP2 and the counters H2 and L2, respectively. Here, since the comparator CP1, the counter H2, and the dummy buffer circuit A2 perform identical operations to the comparator CP2, the counter L2, and the dummy buffer circuit A4, an explanation will be given concerning operations of the comparator CP2, the counter L2, and the dummy buffer circuit A4. Moreover, the control signals CT2 and CT3 here are at a low level, and the Nch transistors NM5 and NM6 are in an OFF state.

Figure 5:
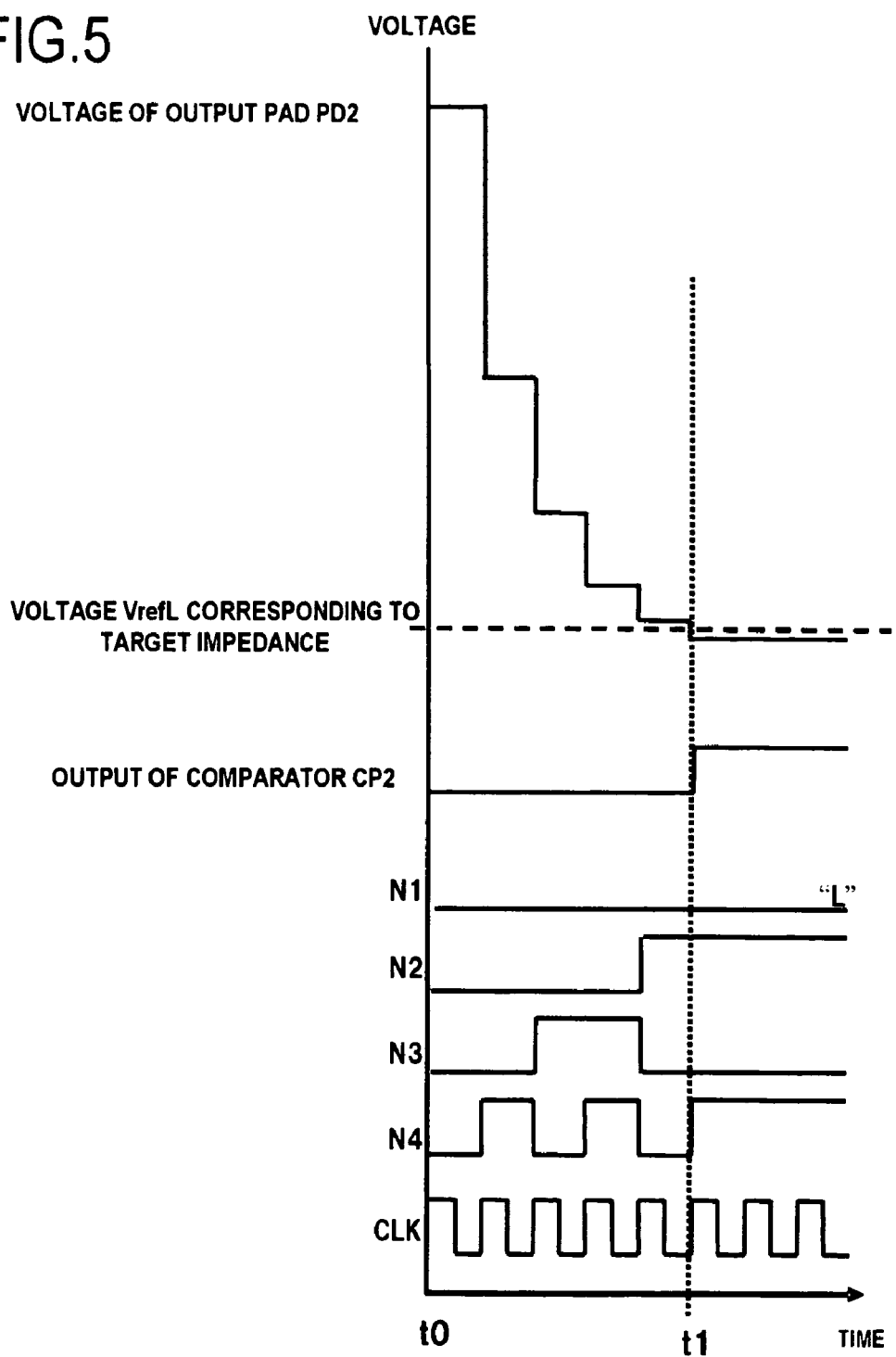
FIG. 5 is a timing chart representing operation of an automatic impedance adjustment unit.

FIG. 5 is a timing chart showing operation of the automatic impedance adjuster D1. In FIG. 5, setting information for the output pad PD2 is expressed as output voltage of the output pad PD2, and other signals are represented at the H level and the L level. At timing t0, the counter L2 is initialized, and outputs of count values N1 to N4 are all at the L level. With regard to this, output of the count values N1 to N4 is sequentially incremented by the clock signal CLK being inputted to the counter L2. The Nch transistors NM1 to NM4, to whose gates the count values N1 to N4 are inputted, are turned ON and OFF according to logic values of the count values N1 to N4. On the other hand, voltage of the output pad PD2 is determined by voltage division of the Nch transistors NM1 to NM4, and the resistance element R32. Here, by the Nch transistors NM1 to NM4 being turned ON and OFF, impedance ratio of the dummy buffer circuit A4 changes as shown in FIG. 6. Therefore, the voltage of the output pad PD2 successively (stepwise) decreases along with counting, as shown in FIG. 5. Furthermore, the impedance ratio of the dummy buffer circuit A4 of FIG. 6 is expressed as an impedance ratio when ON resistance of the Nch transistor NM1 is 1.

By the automatic impedance adjuster D1 operating as above, when the counter L2 is incremented, output of the comparator CP2 goes from the L level to the H level, with the voltage of the output pad PD2 at timing t1, for example, being lower than the reference voltage VrefL. When the output of the comparator CP2 goes above the H level, a counting operation of the counter L2 is stopped, and adjustment is completed. With the count values N1 to N4 of the counter L2 at this time as impedance adjustment signals of the Nch transistors of the output buffer circuits B1, B2, and B3, distribution is made to the adjustment value holders E15 to E18. Moreover, operations of the comparator CP1, the counter H2, and the dummy buffer circuit A2 are similar to the abovementioned explanation, and with the count values P1 to P4 of the counter H2 as impedance adjustment signals of the Pch transistors of the output buffer circuits B1, B2, and B3, distribution (delivery) is made to the adjustment value holders E11 to E14.

As described above, the Nch transistors NM21 to NM24 in the output buffer circuits B1, B2, and B3 have impedances identical to the respective Nch transistors NM1 to NM4 of the dummy buffer circuit A4 of the automatic impedance adjuster A1. Furthermore, the Pch transistors PM21 to PM24 in the output buffer circuits B1, B2, and B3 have impedances identical to the respective Pch transistors PM1 to PM4 of the dummy buffer circuit A2 of the automatic impedance adjuster A1.

Therefore, output impedances of each of the output buffer circuits B1, B2, and B3 are identical to impedances adjusted by the automatic impedance adjuster D1. By timely adjustment of output impedances of the output buffer circuits B1, B2, and B3, the output buffer circuits B1, B2, and B3 are set to optimal output impedances. At this time, the output buffer circuits B1, B2, and B3 can output signals of respective input terminals Data1, Data2, and Data3 to the output pads PD3a, PD3b, and PD3c at optimal output impedances.

Moreover, the automatically adjusted output impedances are expressed as in the following Formula 1 and Formula 2.

$$RtargetH = r31 \times (VDD - VrefH)/VrefH \quad \text{(Formula 1)}$$

$$RtargetL = r32 \times VrefL/(VDD - VrefL) \quad \text{(Formula 2)}$$

The following is to be noted:

RtargetH: impedance automatically adjusted on the Pch transistor side;

RtargetL: impedance automatically adjusted on the Nch transistor side;

VrefH: reference voltage used on the Pch transistor side;

VrefL: reference voltage used on the Nch transistor side;

r31: resistance value of the resistance element R31 used on the Pch transistor side;

r32: resistance value of the resistance element R32 used on the Nch transistor side; and VDD: power supply voltage of dummy buffer and buffer to be adjusted.

Next, an explanation is given concerning an impedance offset. The output buffer circuits B1, B2, and B3 in FIG. 1 each have different types of interface, and output impedance determined by interface is Rtarget1 for the output buffer circuit B1, Rtarget2 for the output buffer circuit B2, and Rtarget3 for the output buffer circuit B3. Furthermore, the impedance sizes are as in Rtarget1>Rtarget2>Rtarget3.

First, operation of the output voltage switching circuit C2 is explained. By switching gate logic of the switch-operation Pch transistors PM11 and PM12, and the Nch transistors NM11 and NM12 inside the output voltage switching circuit C2, combined impedance of resistors connected in series and the switch-operation transistors varies. Specifically, combined impedance of each of the Pch transistor PM11 and the resistance element R11, and the Pch transistor PM12 and the resistance element R12 varies. Furthermore, combined impedance of each of the Nch transistor NM11 and the resistance element R21, and the Nch transistor NM12 and the resistance element R22 varies.

Here, in cases based on both the control signals CT2 and CT3 having an L level, by the control signal CT2 transitioning to a H level, the combined impedance of the Pch transistor PM11 and the resistance element R11, and combined impedance of the Nch transistor NM11 and the resistance element R21 become low. Moreover, by the control signal CT3 transitioning to a H level, the combined impedance of the Pch transistor PM12 and the resistance element R12, and the combined impedance of the Nch transistor NM12 and the resistance element R22 become low. In such cases, the reference voltage generation circuit A3 and the output voltage switching circuit C2 of FIG. 1 are connected, and the reference voltage VrefH determined from voltage division of each impedance inside the output voltage switching circuit C2 and the reference voltage generation circuit A3, becomes higher, and the reference voltage VrefL becomes lower.

Furthermore, (combined impedance of the Pch transistor PM11 and the resistance element R11)>(combined impedance of the Pch transistor PM12 and the resistance element R12), and (combined impedance of the Nch transistor NM11 and the resistance element R21)>(combined impedance of the Nch transistor NM12 and the resistance element R22). In addition, a combination of logic values of the control signals CT2 and CT3 is made to operate in an order of CT2/CT3=L level/L level, H level/L level, and L level/H level. In such cases, the reference voltage VrefH varies sequentially to become higher in 3 stages, and the reference voltage VrefL varies sequentially to become lower in 3 stages.

Next, operation of the offset switching circuits C1 and C3 is explained. An impedance offset of the dummy buffer circuits A2 and A4 and switching operation thereof are controlled by the control signals CT2 and CT3. In the automatic impedance adjuster D1, as a dummy buffer impedance offset, the offset switching circuit C1 is connected in parallel to the dummy buffer circuit A2, and the offset switching circuit C3 is connected in parallel to the dummy buffer circuit A4. Here, each transistor of the Pch transistors PM5 and PM6 inside the offset switching circuit C1, and the Nch transistors NM5 and NM6 inside the offset switching circuit C3 is turned ON and OFF, and the resistance value of the transistors changes. In this way, by controlling logic values of the control signals CT2 and CT3, it is possible to suitably switch impedances of the dummy buffer circuits A2 and A4 inside the automatic impedance adjuster D1.

Here, (impedance of the Pch transistor PM5)>(impedance of the Pch transistor PM6), (impedance of the Nch transistor NM5)>(impedance of the Nch transistor NM6), and a combination of logic values of the control signals CT2 and CT3 is made to operate in an order of CT2/CT3=L level/L level, H level/L level, and L level/H level. In such cases, size of dummy buffer offset impedance can vary sequentially in 2 stages, from a state of no offset.

In the output buffer circuits B2 and B3, the impedance offsets are not actively set. The reason for this is that the impedance offsets of the output buffer circuits, as shown in FIGS. 3 and 4, have a form in which a transistor whose gate voltage is fixed is connected in parallel with an output impedance unit of an output buffer circuit. In the automatic impedance adjuster D1, impedance of the dummy buffer circuit and the output buffer circuit must be the same, and this applies also to the impedance offset of the dummy buffer circuit and the impedance offset of the output buffer circuit. That is, by combining the impedance offset of the dummy buffer circuit and the impedance offset of the output buffer circuit by the offset switching circuit, with a plurality of interfaces it is possible to make the impedance of the dummy buffer circuit and the impedance of the output buffer circuit the same.

Specifically, in FIGS. 1, 3, and 4, transistor size is the same for each of the Pch transistor PM5 and the Pch transistor PM25, the Pch transistor PM6 and the Pch transistor PM26, the Nch transistor NM5 and the Nch transistor NM25, and the Nch transistor NM6 and the Nch transistor NM26.

Figure 7:
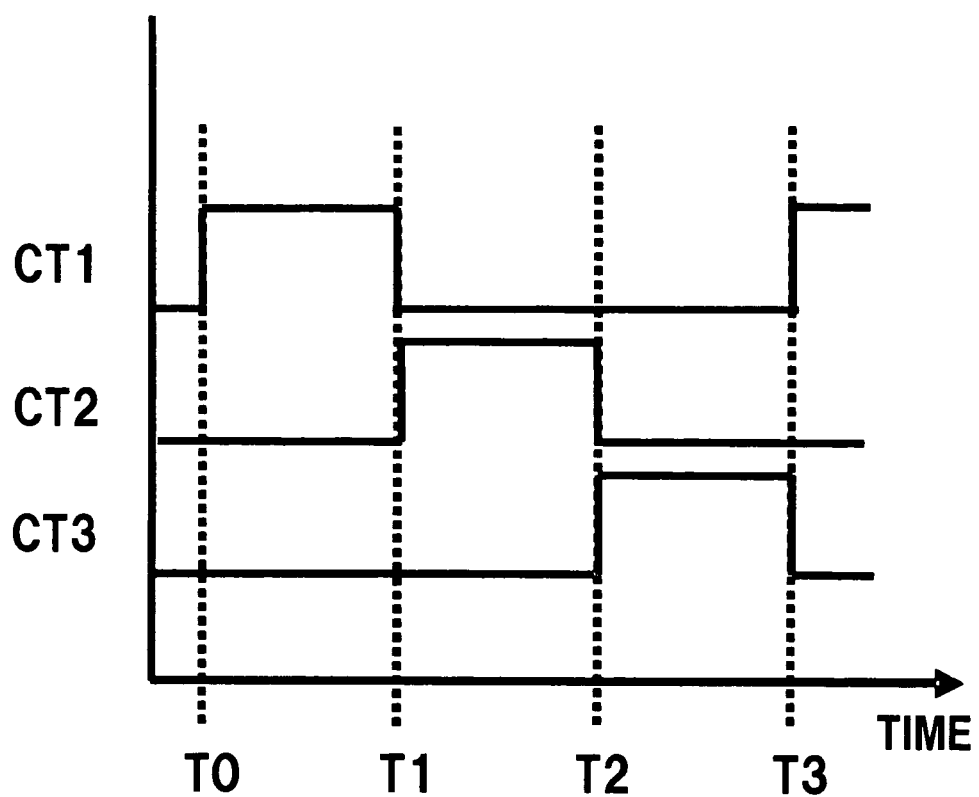
FIG. 7 is a timing chart of a control signal.

Next, operation of the adjustment value holders E11 to E18 is explained. In the adjustment value holders E11 to E18, the control signals CT1, CT2, and CT3 control logic holding circuits E1A, E1B, and E1C, as switching signals for logic holding/passing. When one logic holding circuit in an adjustment value holder is in a passing state, other logic holding circuits are in a holding state, and operation is such that multiple logic holding circuits become not in a passing state (at the same time). Specifically, interfaces of the output buffer circuits B1, B2, and B3 are interface A, interface B, and interface C. In such cases, as in the timing chart shown in FIG. 7, in a period (T0 to T1) in which the control signal CT1 is H and the control signals CT2 and CT3 are L, a mode of the interface A is a state in which an impedance adjustment signal passes through the logic holding circuit E1A in the output buffer circuit B1, to be distributed, and an adjustment signal is not distributed to the output buffer circuits B2 and B3. In a period (T1 to T2) in which the control signal CT2 is H, and the control signals CT1 and CT3 are L, a mode of the interface B is a state in which an impedance adjustment signal passes through the logical holding circuit E1B in the output buffer circuit B2, to be distributed, and an adjustment signal is not distributed to the buffers of the output buffer circuits B1 and B3. In a period (T2 to T3) in which the control signal CT3 is H, and the control signals CT1 and CT2 are L, a mode of the interface C is a state in which an impedance adjustment signal passes through the logical holding circuit E1C in the output buffer circuit B3, to be distributed, and an adjustment signal is not distributed to the buffers of the output buffer circuits B1 and B2. By controlling the control signals CT1 to CT3 in this way, the impedance adjustment signals can be distributed to desired output buffer circuits.

That is, when impedance is automatically adjusted in interface A, the control signals CT1, CT2, and CT3 respectively have H, L, and L levels. At this time, the reference voltages VrefH and VrefL of the reference voltage generation circuit have values with no offset. Furthermore, the dummy buffer circuits and the output buffer circuits are in no-offset states. Additionally, in this state, in the adjustment value holders E11 to E18, the logic holding circuit E1A is in a passing state and the logic holding circuits E1B and E1C are in holding states. Therefore, the impedance adjustment signal is effectively distributed only to the output buffer circuit B1 of the interface A.

Next when impedance is automatically adjusted in interface B, the control signals CT1, CT2, and CT3 respectively have L, H, and L levels. At this time, taking the interface A as reference, the reference voltage VrefH is higher and the reference voltage VrefL is lower. On the other hand, the offset of the dummy buffer circuits and the output buffer circuits is in a form to which the equivalent of the difference of Rtarget1 and Rtarget2 is added. By these operations, the reference voltage corresponds to the impedance of the interface B, and the impedances of the dummy buffer circuits and the output buffer circuits also become the difference of the interface A and the interface B, that is, in a state appropriate to the interface B. Furthermore, in the adjustment value holders E11 to E18, the logic holding circuit E1B is in a passing state and the logic holding circuits E1A and E1C are in a holding state. Therefore, the impedance adjustment signal is effectively distributed only to the output buffer circuit B2 of the interface B.

Finally, when impedance is automatically adjusted for the interface C, the control signals CT1, CT2, and CT3 respectively have L, L, and H levels. At this time, with the interface B as reference, the reference voltage VrefH is higher and the reference voltage VrefL is lower. That is, the size relationship of values with respect to the reference voltage VrefH is represented by interface A<interface B<interface C, and the size relationship values with respect to the reference voltage VrefL is represented by interface A>interface B>interface C. Adjustment range of output voltage of the voltage generation circuit is described in the next section. Moreover, the offset of the dummy buffer circuits and the output buffer circuits is of a form to which the equivalent of the difference of Rtarget1 and Rtarget3 is added. By these operations, the reference voltage corresponds to the impedance of the interface C, and the impedances of the dummy buffer circuits and the output buffer circuits also become the difference of the interface A and the interface C, that is, in a state appropriate to the interface C. Furthermore, in the adjustment value holders E11 to E18, the logic holding circuit E1C is in a passing state and the logic holding circuits E1A and E1B are in a holding state. Therefore, the impedance adjustment signal is effectively distributed only to the output buffer circuit B3 of the interface C.

The above operations are summarized in a list in FIG. 8. By controlling the control signals CT1 to CT3 as in FIG. 8, the impedances of the multiple interfaces A, B, and C can be adjusted by one automatic adjustment circuit without deteriorating adjustment accuracy.

Next, an explanation will be given concerning the necessity of output voltage switching in the reference voltage generation circuit A3. The semiconductor device of the present exemplary embodiment automatically adjusts impedances of a plurality of interfaces, without increasing the output pads (pseudo-pads, external connection pins). In such cases, identical resistance elements R31 and R32 are used in adjusting impedances of each of the interfaces.

As described above, the automatically adjusted impedance is represented by Formula 1 and Formula 2. Here, in order to change the automatically adjusted impedance without changing the resistance values of the resistance elements R31 and R32, it is necessary to change the reference voltages VrefH and VrefL. That is, when RtargetH is made small, the reference voltage VrefH may be made high, and when RtargetL is made small, the reference voltage VrefL may be made low.

Amounts of change of the reference voltages VrefH and VrefL are as follows. The change amount $\Delta VrefH1$ of VrefH from the reference voltage of the interface A, in the interface B, is represented as in Formula 3, below.

$$\Delta VrefH1 = (Rtarget1 - Rtarget2) \times VDD / (R31 + Rtarget1 - Rtarget2) \quad \text{Formula 3}$$

Furthermore, the change amount $\Delta VrefL1$ of VrefL is represented as in Formula 4, below.

$$\Delta VrefL1 = (Rtarget1 - Rtarget2) \times VDD / (R32 + Rtarget1 - Rtarget2) \quad \text{Formula 4}$$

Furthermore, a change amount $\Delta VrefH2$ of VrefH from the reference voltage of the interface A, in the interface C, is represented as in Formula 5, below.

$$\Delta VrefH2 = (Rtarget1 - Rtarget3) \times VDD / (R31 + Rtarget1 - Rtarget3) \quad \text{Formula 5}$$

Furthermore, the change amount $\Delta VrefL2$ of VrefL is represented as in Formula 6, below.

$$\Delta VrefL2 = (Rtarget1 - Rtarget3) \times VDD / (R32 + Rtarget1 - Rtarget3) \quad \text{Formula 6}$$

In order to give this type of change amount to the reference voltage, the output voltage switching circuit C2 is added to the reference voltage generation circuit A3.

An explanation is given below concerning the necessity of using the offset impedance in the present invention. Moreover, as a premise to the explanation, in designing an output buffer, impedance is often substituted by current value (i.e., expressed in terms of current value), and in order to make the representation intuitively easy to understand, an explanation in which the impedance is substituted by current value is given.

By switching the number of parallel connection circuits in the dummy buffers A2 and A4, and the output buffer circuits B1 to B3, the automatic impedance adjuster D1 is configured to obtain a desired impedance. By the number of parallel connection circuits being qualitatively increased, the impedance is small and the current value is large. On the other hand, in an actual design, it is necessary to have a lower limit of adjustment range of an impedance at or below an adjustment target impedance. In other words, an upper limit of an adjustment range of the current must be at or above an adjustment target current value. As a specific example, FIG. 9 shows an example of a design value for a case in which the current value of the output buffer circuit has a potential difference of 0.4 V, and the current value target is 6 mA. In this example, the number of impedance parallel connections is 8, and the current value with all 8 connections connected satisfies the target of 6 mA.

Here, in cases in which one impedance automatic adjustment circuit handles a plurality of interface automatic adjustments, it is necessary to simply change an upper limiting value of the current and to enlarge the adjustment range of the current. An example of such cases is shown in FIG. 10. The example has current target values of 6 mA and 12 mA, and is formed to handle both of these cases. By this arrangement, a plurality of impedances can be handled, but there are cases in which automatic adjustment accuracy deteriorates. An indicator of the automatic adjustment accuracy is current difference for each one of the parallel connections shown in FIG. 9 and FIG. 10, and the larger this is, the lower the automatic adjustment accuracy is. Since the automatic adjustment accuracy is an important element in determining adjustment circuit performance, deterioration of this accuracy is a big problem.

The above problem is a phenomenon which occurs in cases in which the impedance adjustment range is enlarged when a plurality of interfaces are being automatically adjusted. Therefore, the abovementioned offset impedance is necessary so as to handle a plurality of interfaces without enlarging the adjustment range in each interface.

Offset impedance effectiveness has been explained above; for the offset impedance, it is necessary to provide both the dummy buffer circuits and the output buffer circuits, and to adjust impedance, including all the offset impedances. A reason for this is that if offset impedance is excluded from adjustment target, characteristic variation of the offset impedance itself occurs as characteristic variation of impedance of all the dummy buffer circuits and the output buffer circuits. As a result, there is deterioration in the impedance adjustment accuracy of the output buffer circuits. Thus, the present exemplary embodiment is configured giving consideration to this point.

Moreover, a method of setting an offset impedance value in the present exemplary embodiment is as below. In cases in which impedance of a plurality of interfaces is adjusted, among interfaces thereof, necessary impedances for buffers differ. Similarly to what has been described above, impedance determined by interface is Rtarget1 for the output buffer circuit B1, Rtarget2 for the output buffer circuit B2, and Rtarget3 for the output buffer circuit B3. Furthermore, impedance sizes are as in Rtarget1>Rtarget2>Rtarget3. At this time, impedance difference between the output buffer circuits B1 and B2 is Roffset1, and impedance difference between the output buffer circuits B1 and B3 is Roffset2. Roffset1 and Roffset2 are represented as in Formula 7 and Formula 8, using Rtarget1, Rtarget2, and Rtarget3.

Roffset1=Rtarget1×Rtarget2/(Rtarget1−Rtarget2)  Formula 7

Roffset2=Rtarget1×Rtarget3/(Rtarget1−Rtarget3)  Formula 8

Furthermore, assume that the impedance of the Pch transistor PM5 inside the offset switching circuit C1, the Nch transistor NM5 inside the offset switching circuit C3, and the Pch transistor PM25 and the Nch transistor NM25 of FIG. 3 is Roffset1. In addition, assume that the impedance of the Pch transistor PM6 inside the offset switching circuit C1, the Nch transistor NM6 inside the offset switching circuit C3, and the Pch transistor PM26 and the Nch transistor NM26 of FIG. 4 is Roffset1. By controlling the control signals CT1, CT2, and CT3 according to the method of FIG. 8, consideration is given to an optimum impedance difference between each interface, and it is possible to adjust the impedance of each interface, without deterioration of impedance adjustment accuracy of buffers being adjusted.

In the present invention, the necessity for providing the adjustment value holders E11 to E18 is explained below. In a plurality of interfaces, since impedances that are to be automatically adjusted differ, naturally, information concerning impedance adjustment signals also differs for each interface. In cases of the semiconductor device of the present exemplary embodiment, since there is one automatic impedance adjuster D1, it is not possible to adjust each interface at the same time. Therefore, it is necessary to stagger the adjustment time of each interface on a time axis. In such cases, since it is necessary to hold, by some method, information concerning an impedance adjustment signal of an interface not being adjusted, the adjustment value holders E11 to E18 are necessary.

A method of controlling the adjustment value holders E11 to E18 is as in FIG. 8, and by coupling with other circuits to perform control using the control signals CT1, CT2, and CT3, it is possible to hold and to pass logic of the impedance adjustment signals of each interface in a desired form.

Finally, in light of the content described so far, a specific numerical example will be shown and an explanation given concerning an effect. Here, with a power supply of 3.3 V and three types of interface, impedances on an Nch transistor side for interfaces A, B, and C are 50Ω, 25Ω, and 12.5Ω, respectively, resistance values of the resistance element R32 are 362.5Ω, 181.25Ω, and 90.625Ω, and the reference voltage VrefL on the Nch transistor side thereof is 0.4 V. Amount reductions are shown for number of pins, power consumption and layout size when impedances at this time are automatically adjusted. Normally, since the impedances on the Nch transistor side and impedances on a Pch transistor side are equal, it is assumed that (resistance value of the resistance element R32)=(resistance value of the resistance element R31), (reference voltage VrefL)=(VDD−VrefH), and with a power consumption calculation as below, a calculated value of the Nch transistor side and a calculated value of the Pch transistor side are equal.

In conclusion, as shown in FIG. 11, it is understood that a reduction effect in each of the number of pins, the power consumption, and the layout size is obtained, in comparison to a conventional circuit configuration.

First, the number of pins, that is, the number of output pads, is computed. In cases of conventional automatic impedance adjustment circuits, 2 pins are necessary for one adjustment circuit. On the other hand, in the case of the present exemplary embodiment, the number of pins is 2 (PD1 and PD2) and this does not change, even when a plurality of adjustment circuits are present. Thus, an effect of reducing the number of pines is obtained as in FIG. 11.

Next, the power consumption is computed. In the automatic impedance adjuster D1, power is mainly consumed by the comparators CP1 and CP2, and the dummy buffer circuits A2 and A4, and since all of them steadily consume current, the current values are computed. Here, current of the comparators, as a general design indicator, is steady current=1 mA. In addition, current of the dummy buffer circuits are values computed from potential difference of the power supply voltage and the reference voltage and the resistance elements R31 and R32.

Specifically, with regard to current consumed in a comparator, in a conventional circuit configuration there are two comparators in one automated impedance adjustment circuit, and since 3 automated adjustment circuits are necessary, the total is 6 mA. On the other hand, since there is one comparator in the automatic impedance adjuster D1, the total is 2 mA.

Current of dummy buffer units is given specifically in Formula 9.

(VDD−VrefL)/RextL  Formula 9 where
VDD: power supply voltage
VrefL: Nch transistor side reference voltage
RextL: resistance value of externally attached resistance element R32

Here, in a conventional circuit configuration as described above, in the order of the interfaces A, B, and C, the reference voltages are commonly 0.4 V, equivalent resistance values of the resistance elements R32 and R31 are 362.5Ω, 181.25Ω, and 90.625Ω, so that the currents of the dummy buffer units on the Nch transistor side, in the order of the interfaces A, B, and C, are 8 mA, 16 mA, and 32 mA. If the impedances of the Nch transistor side and the Pch transistor side are equal, the total value of consumed power of the dummy buffers of the Nch transistor side and the Pch transistor side respectively of the interfaces A, B, and C is (8+16+32)×2=112 mA.

On the other hand, in the dummy buffer circuits of the present exemplary embodiment, the resistance values of the resistance elements R32 and R31 are fixed at 362.5Ω, determined by the interface A. The reference voltages, in the order of the interfaces A, B, and C, are 0.4 V, 0.19 V, 0.09 V; from these, the power consumption of the dummy buffers is, from the relationship expression of Formula 9, in the order of the interfaces A, B, and C, 8 mA, 8.6 mA, and 8.9 mA. In the present invention, since the interfaces A, B, and C are switched every specific time-period to switch impedances, the power consumption of the dummy buffers, considering an average value of the interfaces A, B, and C, has an average value of 8.5 mA. If the impedances of the Nch transistor side and the Pch transistor side are equal, the current consumption of the dummy buffer units of the present invention is 8.5×2=17 mA.

Based on the above computation, the consumed current of the conventional circuit configuration as an automatic adjustment circuit, is 118 mA, by totaling the comparator component 6 mA, and the dummy buffer component 112 mA. On the other hand, the consumed current of the present exemplary embodiment is 19 mA, by totaling the comparator component 2 mA, and the dummy buffer component 17 mA. Here, since the power supply voltage is 3.3 V, the power consumption of the conventional circuit configuration is 389.4 mW, while the power consumption of the present exemplary embodiment is 62.7 mW, so that a consumed power reduction effect is obtained, as shown in FIG. 11.

Figure 12:
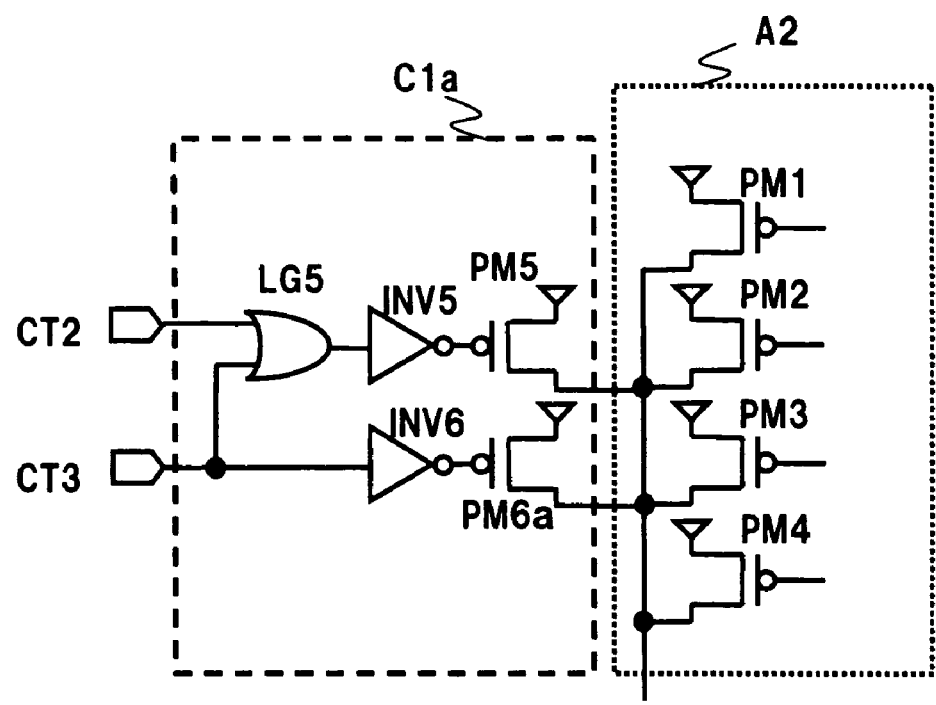
FIG. 12 is a circuit diagram of a first offset switching circuit of a third exemplary embodiment of the present invention.

Finally, layout size is computed. In an automatic impedance adjustment circuit, with regard to circuits and layout, since in the dummy buffers it is necessary for the buffers that are to be adjusted to be correlated, an arrangement is often made by treating buffers on a chip as equal. On the other hand, layout size of one adjustment circuit is about double that of an output buffer. Thus, layout reduction amount in FIG. 12 is also computed with the layout size of one adjustment circuit as double that of an output buffer, and units thereof are taken as the number of output buffers. As a result, a layout size reduction effect is obtained as shown in FIG. 11.

Exemplary Embodiment 2

Exemplary embodiment 1 describes a mode in which automatic adjustment of impedances is performed for three interfaces; an exemplary embodiment of cases in which the interfaces are further increased is as below. First, output voltage switching stages of the output voltage switching circuit C2 of FIG. 1 are switched from the three stages of exemplary embodiment 1 to a number of stages according to the number of types of interface. In such cases, the number of parallel connections of switch elements and resistance elements inside the output voltage switching circuit C2 and the number of impedance switching signals are increased according to the number of interface types.

Specifically, in FIG. 1, for the reference voltage VrefH, the Pch transistor PM11 and the resistance element R11, and the Pch transistor PM12 and the resistance element R12 are connected in parallel. In contrast to this, for cases of handling 5 interfaces, for example, the number of parallel connections of resistance elements and switch elements is increased by 2. In such cases, for the reference voltage VrefL, the number of parallel connections of resistance elements and switch elements is similarly increased by 2.

Next, also with regard to the offset switching circuits C1 and C3, switching takes place from the three steps of exemplary embodiment 1 to a number of stages according to the number of interface types. In such cases, the number of parallel connections of the offset transistors inside the impedance offset circuit and the number of impedance switching signals is increased.

For example, in FIG. 1, for the dummy buffer A4, the offset Nch transistors NM5 and NM6 are connected in parallel. Against this, when five interfaces are being handled, the number of offset transistor parallel connections is increased by 2. Furthermore, in such cases, for the dummy buffer A2 also, the number of offset transistor parallel connections is similarly increased by 2.

For the adjustment value holders E11 to E18, the number of logic holding circuits is increased in accordance with the number of output buffer circuits, and the number of impedance switching signals corresponding thereto is increased.

Furthermore, with regard to the output buffer circuits of added interfaces, suitable impedance offsets are provided corresponding to the added interfaces. A specific value of an impedance offset is given by Formula 7 or Formula 8.

Above, a specific example has been explained for cases corresponding to five interfaces, but the number of interfaces is not limited to five and can be further increased.

Exemplary Embodiment 3

FIG. 12 is a first circuit diagram of an offset switching circuit according to a third exemplary embodiment of the present invention. In FIG. 12 reference symbols identical to those of FIG. 1 represent the same items and explanations thereof are omitted. In an offset switching circuit C1a of FIG. 12 a logic circuit LG5 is added to the offset switching circuit C1 of FIG. 1, and a Pch transistor PM6a is provided instead of the Pch transistor PM6. The logic circuit LG5 obtains a logical sum of control signals CT2 and CT3, to be given to an input end of an inverter circuit INV5.

In the above type of offset switching circuit C1a, when the control signal CT3 is active (at a high level), both Pch transistors PM5 and PM6a operate to function as offset transistors. In addition, when the control signal CT2 is active (at a high level), only the Pch transistor PM5 functions as an offset transistor.

Figure 13:
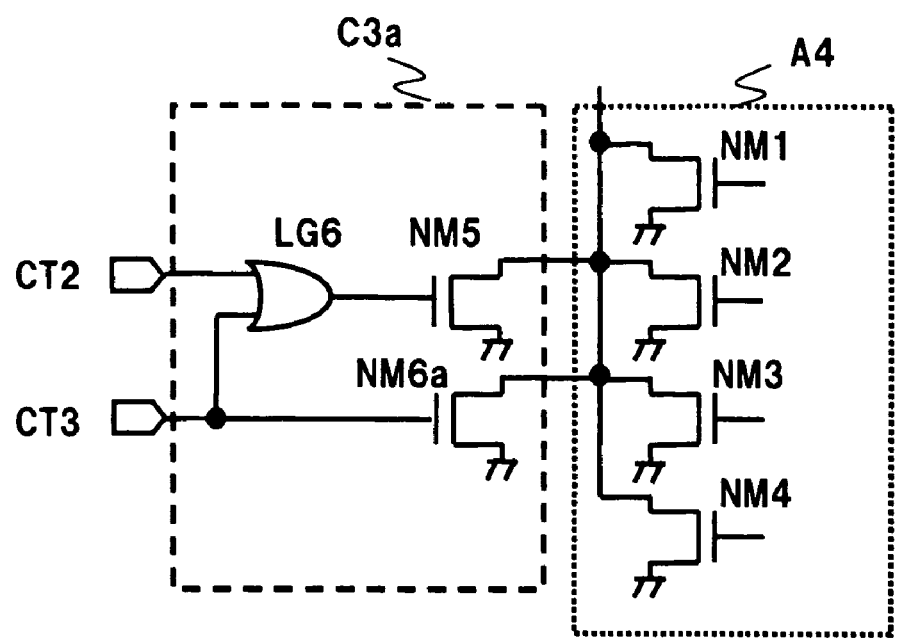
FIG. 13 is a circuit diagram of a second offset switching circuit of a third exemplary embodiment of the present invention.

FIG. 13 is a second circuit diagram of an offset switching circuit according to the third exemplary embodiment of the present invention. In FIG. 13 reference symbols identical to those of FIG. 1 represent the same items and explanations thereof are omitted. In an offset switching circuit C3a of FIG. 13 a logic circuit LG6 is added to the offset switching circuit C3 of FIG. 1, and an Nch transistor NM6a is provided instead of the Nch transistor NM6. The logic circuit LG6 obtains a logical sum of the control signals CT2 and CT3, to be given to a gate of an Nch transistor NM5.

In the above type of offset switching circuit C3a, when the control signal CT3 is active (at a high level), both Nch transistors NM5 and NM6a operate to function as offset transistors. In addition, when the control signal CT2 is active (at a high level), only the Nch transistor NM5 functions as an offset transistor.

Here, interfaces of the output buffer circuits B1, B2, and B3 are respectively taken as interface A, interface B, and interface C. Furthermore, impedance difference between the interface A and the interface B is Roffset1, and impedance difference between the interface A and the interface C is Roffset2. In such cases, Roffset1 and Roffset2 are respectively given by Formula 7 and Formula 8.

In this regard, as in the control method shown in FIG. 8, Roffset1 is valid in control of the interface B and Roffset2 is invalid, and Roffset2 is valid in control of the interface C and Roffset1 is invalid.

Here, impedance Roffset3 of an offset transistor is determined as in Formula 10 as follows.

$$Roffset3 = Rtarget2 \times Rtarget3 / (Rtarget2 - Rtarget3) \quad \text{Formula 10}$$

Control is performed so that Roffset1 only is valid in control of the interface B and both Roffset1 and Roffset2 are valid in control of the interface C. By this type of control, it is possible to obtain offset impedance similar to exemplary embodiment 1. In such cases, an offset transistor control method, that is, addition of a logic circuit to gate input of these transistors is necessary. Specifically, circuit configurations of the offset switching circuits C1 and C3 of FIG. 1 are modified. An example of a circuit modified from the offset switching circuit C1 is shown in the offset switching circuit C1a of FIG. 13. Furthermore, an example of a circuit modified from the offset switching circuit C3 is shown in the offset switching circuit C3a of FIG. 14.

In exemplary embodiment 3, it is possible to reduce layout size of dummy buffer impedance offset transistors, in comparison to exemplary embodiment 1. To facilitate explanations here, for the interface A, impedance determined by interface is given by Rtarget1=100Ω, for the interface B, Rtarget2=75Ω, and for the interface C, Rtarget3=50Ω. Against this, required layout size in exemplary embodiment 1 is computed from Formula 7 and Formula 8 as Roffset1=300Ω and Roffset2=100Ω. On the other hand, required layout size in exemplary embodiment 3 is computed from Formula 7 and Formula 10 as Roffset1=300Ω and Roffset3=150Ω.

As is well known, impedance and transistor size are inversely related. Therefore, with regard to the Pch transistor PM6a and the Nch transistor NM6a, transistor size can be reduced to ⅔ in comparison to the Pch transistor PM6 and the Nch transistor NM6, respectively, of FIG. 1.

All disclosures of the abovementioned Patent Documents and the like are incorporated herein by reference. Modifications and adjustments of exemplary embodiments and examples are possible with regard to the whole disclosure of the present invention (including the scope of the claims), and in addition based on fundamental technological concepts thereof. Furthermore, various combinations and selections of various types of disclosed elements are possible within the scope of the claims of the present invention. That is, the present invention clearly includes various types of change and modification that could be envisaged by a person skilled in the art according to the whole disclosure and the technological concepts, including the scope of the claims.

What is claimed is:

1. A semiconductor device comprising:
   a voltage generation circuit which generates reference voltages;
   a dummy buffer circuit;
   a comparison circuit which compares the reference voltages and an output voltage of said dummy buffer circuit;
   a counter which counts a clock signal until a comparison result of said comparison circuit is matched, wherein said dummy buffer circuit adjusts its own output impedance based on a count value of said counter;
   n (n being an integer greater than or equal to 2) adjustment value holding circuits which hold count values when a comparison result of said comparison circuit is matched; and
   n output buffer circuits which respectively adjust their own output impedances, based on count values respectively held by said adjustment value holding circuits; wherein
   said voltage generation circuit generates the reference voltages respectively corresponding to said n output buffer circuits, said n adjustment value holding circuits hold respective count values when a comparison result, obtained based on respectively corresponding reference voltages, matches, and said dummy buffer circuit adjusts its own output impedance corresponding respectively to said n output buffer circuits.

2. The semiconductor device according to claim 1, wherein said output buffer circuits comprise:
   m (m being an integer greater than or equal to 2) first output transistors which are connected in parallel and drive output pads; and
   m second output transistors that are of a conductivity type opposite to said first output transistors, are connected in parallel, and drive said output pads;
   each of said voltage generation circuit, said comparison circuit, said counter, said dummy buffer circuit, and said n adjustment value holding circuits are provided in groups of 2, corresponding to said first and said second output transistors; and
   respective driving counts of said first and said second output transistors are determined according to count values respectively held by two of said adjustment value holding circuits.

3. The semiconductor device according to claim 2, wherein said dummy buffer circuit comprises:
   a first dummy buffer circuit including m first dummy transistors, which are connected in parallel and drive a first pseudo-pad; and
   a second dummy buffer circuit including m second dummy transistors that are of a conductivity type opposite to said first dummy transistors, are connected in parallel, and drive a second pseudo-pad; and
   respective driving counts of said first and said second dummy transistors are determined according to count values respectively held by two of said counters.

4. The semiconductor device according to claim 3, wherein said output buffer circuit is an output buffer circuit with output offset transistor comprising:
   first output offset transistors connected in parallel to said first output transistors and having a conductivity type the same as said first output transistors; and
   second output offset transistors connected in parallel to said second output transistors and having a conductivity type the same as said second output transistors;
   said dummy buffer circuit comprises:
   first offset transistors having a conductivity type the same as said first dummy transistors; and
   second offset transistors having a conductivity type the same as said second dummy transistors;
   and in cases in which said dummy buffer circuit determines driving count of each of said first and said second output transistors of said output buffer circuit with output offset transistor, control is performed so that said first offset transistors are connected in parallel to said first dummy transistors, and said second offset transistors are connected in parallel to said second dummy transistors.

5. The semiconductor device according to claim 4, wherein said first output offset transistors and said first offset transistors are the same size, and said second output offset transistors and said second offset transistors are the same size.

6. The semiconductor device according to claim 4, wherein said dummy buffer circuit comprises at least 2 of said first offset transistors, and an equal number of said second offset transistors to that of said first offset transistors; and
   in cases in which said dummy buffer circuit determines driving count of each of said first and said second output transistors of said output buffer circuit with output offset transistor, control is performed so that at least 2 of said first offset transistors are selectively connected in parallel to said first dummy transistors, and at least 2 of said second offset transistors are selectively connected in parallel to said second dummy transistors.

7. The semiconductor device according to claim 6, wherein ON-time impedance of said first output offset transistors and total ON-time impedance of said selected first offset transistors are the same, and ON-time impedance of said second output offset transistors and total ON-time impedance of said selected second offset transistors are the same.

* * * * *